(12) United States Patent
Ray

(10) Patent No.: US 7,417,242 B2
(45) Date of Patent: Aug. 26, 2008

(54) METHOD OF MEASURING ION BEAM POSITION

(75) Inventor: Andrew M. Ray, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 355 days.

(21) Appl. No.: 11/390,039

(22) Filed: Mar. 27, 2006

(65) Prior Publication Data

US 2006/0219955 A1 Oct. 5, 2006

Related U.S. Application Data

(60) Provisional application No. 60/667,455, filed on Apr. 1, 2005.

(51) Int. Cl.
G21F 5/10 (2006.01)
H01J 37/08 (2006.01)

(52) U.S. Cl. .............................. 250/492.21; 250/492.1; 250/442.11; 250/397; 250/310; 250/311; 250/398; 250/491.1; 250/492.2; 250/423 R; 250/492.3; 250/396 R; 250/396 ML; 250/424; 250/492.22; 250/441.11; 313/111.01; 313/111.31

(58) Field of Classification Search .............. 250/492.1, 250/442.11, 397, 310, 311, 398, 491.1, 492.2, 250/423 R, 492.3, 396 R, 396 M, 424, 492.22, 250/441.11 L; 313/111.01, 111.31
See application file for complete search history.

(56) References Cited

U.S. PATENT DOCUMENTS

| 6,690,022 | B2 * | 2/2004 | Larsen et al. | ........... 250/492.21 |
| 6,763,316 | B2 | 7/2004 | Evans | |
| 2006/0097195 | A1 * | 5/2006 | Angel et al. | ........... 250/492.21 |

* cited by examiner

Primary Examiner—Jack I. Berman
Assistant Examiner—Meenakshi S Sahu
(74) Attorney, Agent, or Firm—Eschweiler & Associates, LLC

(57) ABSTRACT

A system, apparatus, and method for determining position and two angles of incidence of an ion beam to a surface of a workpiece is provided. A measurement apparatus having an elongate first and second sensor is coupled to a translation mechanism, wherein the first sensor extends in a first direction perpendicular to the translation, and wherein the second sensor extends at an oblique angle to the first sensor. The first and second elongate sensors sense one or more characteristics of the ion beam as the first and second sensors pass through the ion beam at a respective first time and a second time, and a controller is operable to determine a position and first and second angle of incidence of the ion beam, based, at least in part, on the one or more characteristics of the ion beam sensed by the first sensor and second sensor at the first and second times.

20 Claims, 6 Drawing Sheets

METHOD OF MEASURING ION BEAM POSITION

Related Application

This application claims priority to U.S. Provisional Application No. 60/667,455 filed Apr. 1, 2005, which is entitled "Method of Measuring Beam Angle".

FIELD OF THE INVENTION

The present invention relates generally to ion implantation systems, and more specifically to a system, apparatus, and method for measuring a position and angle of incidence of an ion beam.

BACKGROUND OF THE INVENTION

In the manufacture of semiconductor devices and other products, ion implantation systems are used to impart impurities, known as dopant elements, into semiconductor wafers, display panels, or other workpieces. Typical ion implantation systems or ion implanters treat a workpiece with an ion beam in order to produce n- or p-type doped regions, or to form passivation layers in the workpiece. When used for doping semiconductors, the ion implantation system injects a selected ion species to produce the desired extrinsic material. Typically, dopant atoms or molecules are ionized and isolated, sometimes accelerated or decelerated, formed into a beam, and swept across a wafer. For example, the ion beam may be manipulated to "scan" the wafer, or the wafer may be translated with respect to a generally stationary ion beam. Dopant ions then physically bombard and enter the surface of the wafer, and subsequently come to rest below the surface.

A typical ion implantation system is generally a collection of sophisticated subsystems, wherein each subsystem performs a specific action on the dopant ions. Dopant elements can be introduced in gas form or in a solid form that is subsequently vaporized, wherein the dopant elements are positioned inside an ionization chamber and ionized by a suitable ionization process. For example, the ionization chamber is maintained at a low pressure (e.g., a vacuum), wherein a filament is located within the chamber and heated to a point where electrons are created from the filament source. Negatively-charged electrons from the filament source are then attracted to an oppositely-charged anode within the chamber, wherein during the travel from the filament to the anode, the electrons collide with the dopant source elements (e.g., molecules or atoms) and create a plurality of positively charged ions from the source elements.

Generally, in addition to desired dopant ions being created, other non-desirable positive ions are also created. Accordingly, the desired dopant ions are selected from the plurality of ions by a process referred to as analyzing, mass analyzing, selection, or ion separation. Selection, for example, is accomplished by utilizing a mass analyzer that creates a magnetic field, wherein ions from the ionization chamber travel through the magnetic field. The ions generally leave the ionization chamber at relatively high speeds, wherein the ions are consequently bent into an arc by the magnetic field. The radius of the arc is dictated by the mass of individual ions, speed, and the strength of the magnetic field. Accordingly, an exit of the analyzer permits only one species of ions (e.g., the desired dopant ions) to exit the mass analyzer.

Subsequently, the desired ions may be transported through ion optical elements that serve the purpose of manipulating the ions to focus or affect the trajectory of the ions, wherein the ion optical elements generally match the angles of the ion trajectory to the needs of the implant. Alternatively, the ion energies are changed to meet the needs of the implant, or the ions are deflected in order to cover a workpiece of a relatively large size. Any or all of these manipulation effects can be utilized by the ion implantation system to achieve a desired implant to the workpiece.

Accordingly, the dopant ions are then directed towards a target workpiece that is situated in an end station. Consequently, the dopant ions (e.g., in the form of a "pencil" or spot beam) impact the workpiece with a particular beam intensity and emittance, wherein the beam intensity is generally a measure of the number of particles impacting the workpiece per unit time as a function of position on the workpiece, and the emittance is an angular distribution (e.g., angle of incidence) of the ion beam as a function of the position. Generally, it is desirable that the beam intensity and emittance be substantially uniform and at expected or desired values.

Typically, it is desirable to determine the emittance of the ion beam in both horizontal and vertical directions with respect to the surface of the workpiece. However, conventional emittance measurement devices that are capable of measuring emittance in both horizontal and vertical directions are either substantially complex (thus adding complexity to the ion implantation system), and/or generally require a movement of the measurement device in both horizontal and vertical directions in order to determine both horizontal and vertical angles of incidence of the ion beam. Accordingly, a need currently exists for an improved system and method for determining the emittance of the ion beam, wherein the system and method provide a less-complex, single-axis movement of the measurement device to achieve acceptable emittance measurements.

SUMMARY OF THE INVENTION

The present invention overcomes the limitations of the prior art by providing a system, apparatus, and method for determining a position and angles of incidence of an ion beam in an ion implantation system. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an ion implantation system and a measurement apparatus for measuring a position of the ion beam in two orthogonal directions relative to a workpiece. Further, the measured position can be utilized to determine angles of incidence of the ion beam to the workpiece. According to one exemplary aspect of the invention, the ion implantation system comprises an ion implanter operable to form an ion beam and a measurement apparatus, wherein the measurement apparatus further comprises a first elongate sensor and a second elongate sensor associated with a plane of the apparatus. The first elongate sensor, for example, extends in a first direction along the plane of the measurement apparatus, wherein the first elongate sensor is operable to sense one or more characteristics of the ion beam. The second elongate sensor extends along the plane at an angle that is oblique to the first elongate sensor, wherein the second elongate sensor is further operable to sense the one or more characteristics of the ion beam.

According to another exemplary aspect of the invention, a translation mechanism is provided, wherein the translation mechanism is operably coupled to the ion implanter and the measurement apparatus, and wherein the translation mechanism is operable to translate the measurement apparatus through a path of the ion beam in a direction generally perpendicular to the first elongate sensor. Thus, the translation mechanism is operable to translate the first and second sensors through the ion beam, wherein a peak or maximum of the one or more characteristics, such as a peak beam current, can be determined by the first and second sensor as they pass through the ion beam. One or more of a time and position of the measurement apparatus associated with the peak beam current sensed at the respective first and second sensors is fed to a controller, wherein the controller is operable to determine a first beam position and a second beam position of the ion beam with respect to the plane of the measurement apparatus. Further, the controller is operable to determine a first beam angle and a second beam angle of the ion beam with respect to the plane of the measurement apparatus.

Accordingly, the position of the ion beam at the plane of the measurement apparatus is measured in two dimensions via the translation of the measurement apparatus and the sensing of the first and second peak beam currents. In accordance with another exemplary aspect of the invention, the first beam angle and second beam angle are determined based, at least in part, on the position of the measurement apparatus when the first and second peak beam currents are sensed and a known position of the ion beam when the ion beam orthogonally strikes the plane of the measurement apparatus. Furthermore, a distance between a known location of the ion beam upstream of the measurement apparatus and the known position of the orthogonal ion beam is utilized to determine the first and second beam angles, when the measurement apparatus is translated in a single direction generally perpendicular to the first sensor. Such a single direction of motion of the measurement device can therefore be utilized to determine a two-dimensional angle of incidence of the ion beam to a workpiece, thus allowing a characterization of the ion beam without adding a more complex second degree of motion to the measurement apparatus.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
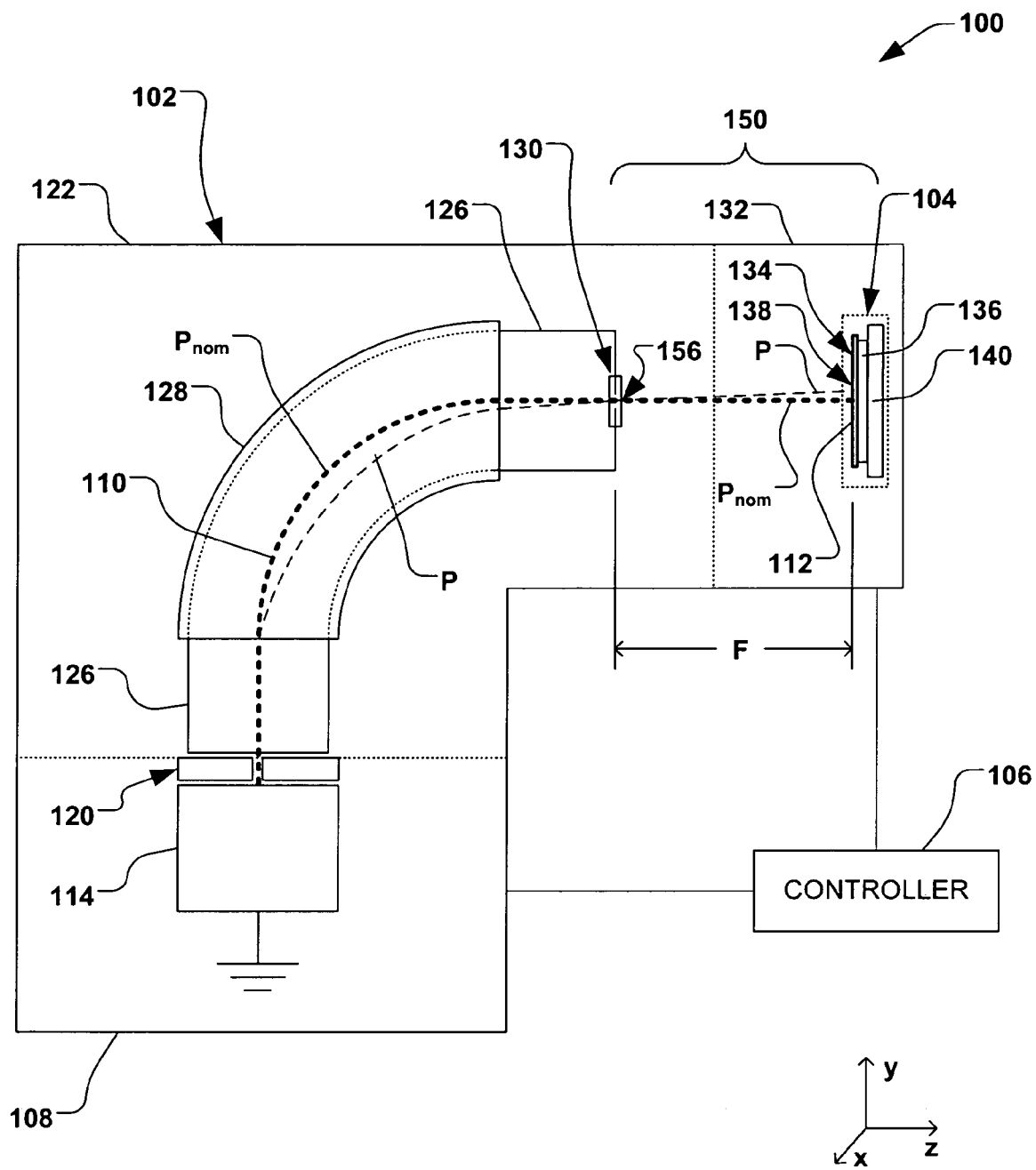
FIG. 1 illustrates a plan view of an exemplary ion implantation system in accordance with one aspect of the present invention.

The present invention is directed generally towards a system, apparatus, and method for measuring a position of an ion beam in two orthogonal directions within an ion implantation system. More particularly, the system, apparatus, and method provide for measuring ion beam position and angles in two dimensions by moving a measurement device through the ion beam along a single axis. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Ion beam profile and angular content are significant in determining uniformity of an ion implantation, as well as in performing adjustments to increase uniformity during ion implantation processes. One characteristic related to uniformity is ion beam intensity, which is a measure of the number of particles per unit time at a given location of an ion beam cross section. Another characteristic related to uniformity is ion beam angle, which is the angular orientation of the ion beam as a function of a trajectory of the beam as it travels toward a target workpiece. The ion beam angle is generally defined as an angle between the normal to the plane of a surface of the workpiece and a trajectory of the ion beam (e.g., a "pencil" beam), wherein the angle is measured in two dimensions with respect to the plane of the workpiece.

In certain ion implanters (e.g., some types of serial ion implanters), the ion beam is scanned with respect to the workpiece, such as wherein the ion beam remains generally stationary while a plane of the workpiece is scanned through a path of the ion beam. Alternatively, the target workpiece can remain generally stationary in one plane while the ion beam is scanned across the surface of the workpiece. Other ion implanters, for example, generally referred to as batch ion implanters, can employ a rotating disk or platen, whereon a number of workpieces are generally affixed and rotated through a stationary incident ion beam. It will be appreciated that present invention can be implemented on all such classes of ion implanters, and any such implementation is contemplated as falling within the scope of the present invention.

It should also be noted that ion beam profile and angular content are particularly important in determining implant uniformity in serial implanters, since various portions of the target workpiece may be implanted by different parts of the ion beam. Furthermore, it may be necessary to manipulate angular content and/or ion beam profile prior to ion implantation, wherein such manipulation is performed in order to obtain a substantially uniform implant across the target workpiece. Accordingly, the present invention facilitates semiconductor device fabrication by determining beam position and angle of incidence values in two dimensions with respect to the surface of the target workpiece, wherein such a determination of the two-dimensional position and angle of incidence generally facilitates a tuning of the ion implanter to achieve desirable ion implantation results, such as by making adjustments to the generation and/or delivery of the ion beam. The adjustments can be further employed to improve uniformity of the ion beam, as well as to alter a "tilt" angle (e.g., a desired angle of ion implantation) to a preferred value.

Referring now to the figures, FIG. 1 illustrates an exemplary simplified ion implantation system 100, wherein the exemplary ion implantation system is suitable for implementing one or more aspects of the present invention. The system 100 comprises an ion implantation apparatus 102 (also referred to as an ion implanter) and a measurement apparatus 104, wherein the ion implantation apparatus and the measurement apparatus are further operably coupled to a controller 106. The controller 106, for example, is operable to substantially control an operation of one or more of the ion implantation apparatus 102 and the measurement apparatus 104, in accordance with one or more aspects of the present invention that will be discussed hereafter. It should be noted that the ion implantation system 100 depicted in FIG. 1 is provided for illustrative purposes and is not intended to include all aspects, components, and features of an ion implantation system. Instead, the exemplary ion implantation system 100 is depicted so as to facilitate a further understanding of the present invention.

The ion implantation apparatus 102 associated with the ion implantation system 100, for example, generally comprises an ion source 108 for producing a quantity of ions operable to travel along an ion beam path P, thus defining an ion beam 110 for implantation of the ions to a workpiece 112 (e.g., a semiconductor wafer, display panel, etc.). The ion source 108, for example, comprises a plasma chamber 114, wherein positively charged ions are generated from a process gas (not shown) within the plasma chamber by an application of power thereto. The process gas may comprise a source material such as an ionizable gas or vaporized solid source material or species that has been previously vaporized. For an n-type implantation to the workpiece 112, for example, the source materials may comprise boron, gallium or indium. For a p-type implantation, the source materials may comprise arsenic, phosphorus, or antimony.

The ion source 108 further comprises an extraction assembly 120 associated therewith, wherein charged ions are extracted from the ion source upon an application of an extraction voltage thereto. A beamline assembly 122 is further provided downstream of the ion source 108, wherein the beamline assembly generally receives the charged ions. The beamline assembly 122, for example, comprises a beamguide 126, a mass analyzer 128, and an aperture 130, wherein the beamline assembly is operable to form and shape the ion beam 110.

The mass analyzer 128, for example, further comprises a field generating component, such as a magnet (not shown), wherein the mass analyzer generally provides a magnetic field across the ion beam 110, thus deflecting ions from the ion beam at varying trajectories according to a charge to mass ratio of the ions. For example, ions traveling through the magnetic field experience a force that directs individual ions of a desired charge to mass ratio along the beam path P and deflects ions of undesired charge to mass ratios away from the beam path. Once through the mass analyzer 128, the ion beam 110 is directed though the aperture 130, wherein the ion beam is generally limited to produce a concise beam for implantation to the workpiece 112.

The ion implantation apparatus 102 further comprises an end station 132 generally located downstream of the ion beam 110, wherein the workpiece 112 generally resides within the end station. In the manufacture of integrated circuit devices, display panels, and other products, it is generally desirable to uniformly implant dopant species of ions across an entire surface 134 of the workpiece 112. Such an implantation can be performed on a single workpiece 112 in a "serial" ion implantation apparatus 102, wherein the workpiece generally resides on a pedestal or chuck 136 situated within the end station 132, or, alternatively, the ion implantation apparatus 102 can be configured to implant ions into multiple workpieces (e.g., a "batch" ion implanter), wherein the end station 132 comprises a rotating platter (not shown), whereon several workpieces are translated with respect to the ion beam 110.

The ion beam 110, for example, can be further moved or scanned across the workpiece 112 via a control of the path P of the ion beam by the ion implantation apparatus 102. Alternatively, the end station 132 is operable to move the workpiece 112 through a generally stationary ion beam 110 at a controlled rate, so as to achieve desired implantation results. It should be noted that although the ion beam 110 is depicted as being a spot or "pencil" beam substantially orthogonal to the surface 134 of the workpiece 112, the ion beam can also be at other incident angles with the surface of the workpiece (e.g., an angle greater than 0°, where 0° is a associated with the ion beam being perpendicular to the surface). In another alternative, the ion beam 110 may comprise a ribbon beam, wherein the ion beam is generally elongated in cross-section. It should be therefore understood that any ion implantation apparatus operable to extract ions from an ion source and implant them into one or more workpieces is therefore contemplated as falling within the scope of the present invention.

In accordance with one aspect of the present invention, the ion implantation system 100 is operable to characterize the ion beam 110 directed along the beam path P via the measurement apparatus 104. Therefore, a uniformity of the ion implantation into the workpiece 112 can be generally controlled via feedback from the measurement apparatus 104. For example, the ion beam 110 comprises a "pencil" beam having a number of characteristics, such as shape, dopant type, dose, beam current, intensity, emittance, angle of incidence, energy, and the like, wherein the measurement apparatus 104 is operable to determine one or more of the number of characteristics for a given implant.

The measurement apparatus 104 in the present example is generally positioned within the end station 132 and generally in-line with the ion beam 110 (e.g., along the ion beam path P). For example, the measurement apparatus 104 may be integrated into the pedestal or chuck 136, wherein a plane 138 of the measurement apparatus is in substantially the same plane as the surface 134 the workpiece 112, and wherein a distance F is known between the plane of the measurement apparatus and a known location of the ion beam 110 upstream of the workpiece (e.g., at the aperture 130). Alternatively, the measurement apparatus 104 generally resides anywhere between the beamline assembly 122 and the end station 132, wherein the distance F is measured or known between the normal to a plane 138 of the measurement apparatus and a known position (not shown) of the ion beam 110 that is downstream of the beamline assembly, yet upstream of the measurement apparatus. For example, as opposed to being in the same plane 134 of the workpiece 112, the measurement apparatus 104 may generally reside in front of or behind the plane of the workpiece. As such, the measurement apparatus 104 may be respectively translated in front of the workpiece 112 prior to ion implantation into the workpiece, or the translation mechanism may generally reside downstream of the workpiece, wherein the measurement device is utilized in the absence of the workpiece in the end station 132. Regardless of the location of the measurement device 104, the distance F between the normal to the plane 138 of the measurement device to the known position of the ion beam 110 upstream of the measurement device should be known or measured.

In accordance with another exemplary aspect of the present invention, the ion implantation system 100 of FIG. 1 further comprises a translation mechanism 140 operably coupled to the measurement apparatus 104, wherein the translation mechanism is operable to translate the measurement apparatus in the horizontal or x direction. The translation mechanism 140, for example, comprises a servo motor, wherein the servo motor is operable to provide a signal to the controller 106 associated with a position of the measurement apparatus 104. For example, the translation mechanism 140 is further operably coupled to the controller 106, wherein the controller is operable to control the translation of the translation mechanism 140. According to another example, the controller is operable to determine the position of the measurement apparatus 104, wherein the position of the measurement apparatus can be further utilized to determine the ion beam characteristics, as will be discussed infra. For example, the position of the measurement apparatus 104 can be determined by the controller 106 by timing the translation of the of the measurement apparatus when the translation mechanism 140 translates the measurement apparatus at a constant velocity. In another example, the translation mechanism 140 is also operably coupled to the chuck 136, wherein the translation mechanism is further operable to translate the chuck, and thus, the workpiece 112, in the horizontal scan direction (e.g., x direction).

Figure 2:
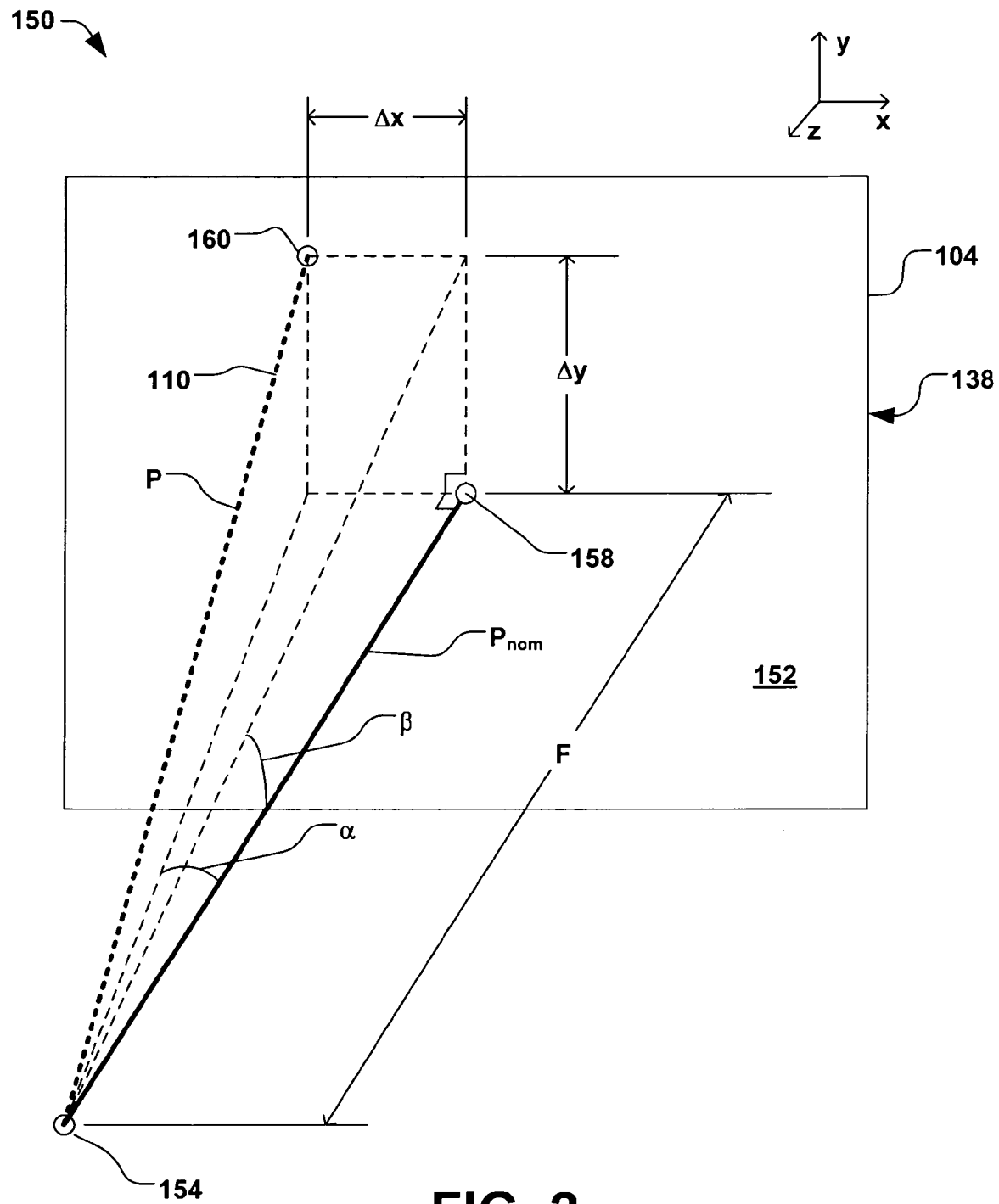
FIG. 2 is a perspective view of a portion of the ion implantation system according to one aspect of the present invention.

Referring now to FIG. 2, a perspective view of a portion 150 of the ion implantation system 100 of FIG. 1 is illustrated, wherein several aspects of the invention can be further appreciated. As illustrated in FIG. 2, the distance F is generally defined along a predetermined trajectory or nominal path $P_{nom}$ of the ion beam 110 when the nominal path $P_{nom}$ of the ion beam is generally orthogonal to the plane 138 of the measurement apparatus 104 (e.g., a surface 152 of the measurement apparatus). The distance F, for example, is generally defined between a known first location 154 along the nominal path $P_{nom}$ of the ion beam 110 (e.g., an exit 156 of the aperture 130 of FIG. 1) and a known second location 158 along the nominal path $P_{nom}$ associated with the measurement apparatus 104 (e.g., at the surface 152 of the measurement apparatus or chuck 136 of FIG. 1).

The actual path P of the ion beam 110 (and hence, an actual position 160 of the ion beam on the plane 138 of the measurement apparatus 104), as illustrated in FIG. 2, however, can deviate from the nominal path $P_{nom}$, wherein the deviation can occur for several reasons, such as variations in tuning of the beamline assembly 122 of FIG. 1, orientation of the aperture 130, or various other reasons. Such a deviation of the actual path P from the nominal path $P_{nom}$ may or may not be intended for the desired ion implantation. Accordingly, the angular deviation of the actual path P of the ion beam 110 from the nominal path $P_{nom}$ can be of great interest for a uniform ion implantation.

Therefore, as illustrated in FIG. 2, the present invention will now describe a determination of a first beam angle α of the ion beam 110 in a first direction (e.g., a horizontal or x direction) and a second beam angle β of the ion beam 110 in a second direction (e.g., a vertical or y direction), wherein the first and second beam angles can be determined using the measurement apparatus 104 and ion implantation system 100 of FIG. 1. According to FIG. 2, since the distance F is known, the first beam angle α and second beam angle β can be determined as:

$$\alpha = \arctan(\Delta x / F) \quad (1)$$

and $$\beta = \arctan(\Delta y / F) \quad (2)$$

where Δx is the deviation of the actual position 160 of the ion beam 110 from the known second position 158 in the first direction and Δy is the deviation of the ion beam in the second direction.

Figure 3:
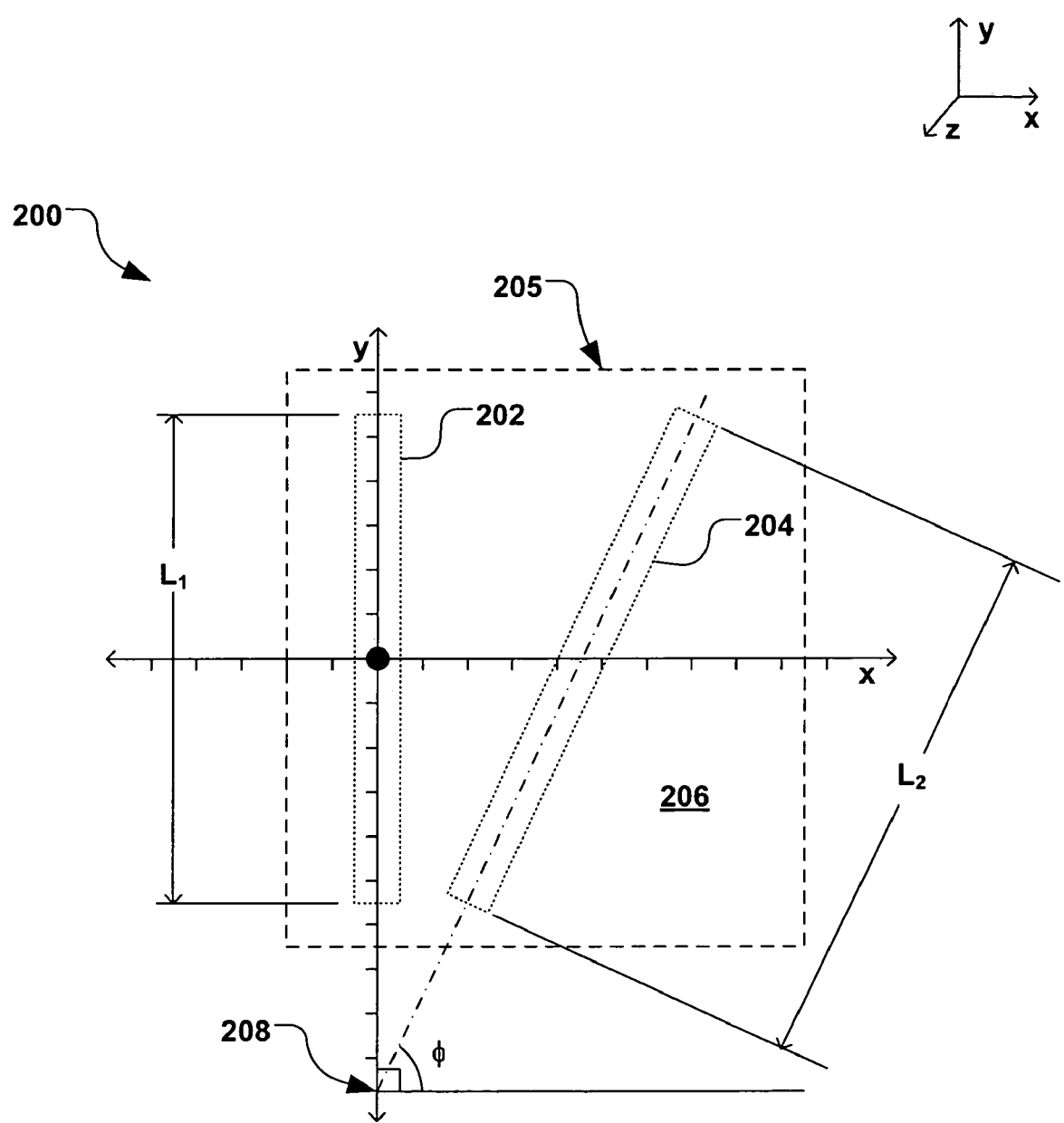
FIG. 3 is a plan view of an exemplary measurement apparatus according to another aspect of the present invention.

Referring now to FIG. 3, an exemplary measurement apparatus 200 is illustrated, such as the apparatus 104 in FIG. 1, wherein the exemplary measurement apparatus 200 is shown in greater detail. The measurement apparatus 200, for example, comprises a first sensor 202 and a second sensor 204, wherein the first sensor and second sensor are positioned on a plane 205 of the measurement apparatus. In the present example, the first sensor 202 and second sensor 204 are associated with a surface 206 of the measurement apparatus. It should be noted, however, that measurement apparatus 200 need not comprise a surface 206, so long as the first sensor 202 and second sensor 204 are positioned on the plane 205 of the measurement apparatus (e.g., the first and second sensors are coupled to the measurement apparatus by brackets positioned on the plane). In one example, the first sensor 202 and second sensor 204 each comprise a respective elongate Faraday cup coupled to the surface 206 of the measurement apparatus 200, wherein each Faraday cup is operable to determine one or more characteristics of the ion beam (not shown), such as beam current or intensity.

The first sensor 202, for example, is positioned generally parallel to the y axis on the x-y plane of the surface 206 of the measurement apparatus 200, wherein the second sensor 204 is positioned generally obliquely with respect to the first sensor on the x-y plane of the surface. An imaginary intersection point 208 of the first sensor 202 and second sensor 204 can be defined by extending the centerlines of each elongate sensor to the point of intersection. Consequently, the second sensor 204 is positioned at an oblique angle φ to the first sensor on the surface 206 of the measurement apparatus 200, wherein the oblique angle, for example, ranges between approximately 30° and 60° from a point perpendicular to the first sensor. A first length $L_1$ of the first sensor 202, for example, is associated with a potential maximum vertical deviation (e.g., in the y direction) of the ion beam 110 of FIGS. 1 and 2. A second length $L_2$ of the second sensor 204 of FIG. 3, for example, is further associated with the potential maximum vertical deviation of the ion beam 110 of FIGS. 1 and 2. For example, the second sensor 204 of FIG. 3 generally extends the length $L_1$ in the vertical or y direction, while extending at the oblique angle φ from the first sensor 202, thus making the $L_2$ greater than $L_1$.

Since the measurement apparatus 200 is generally coupled to the translation mechanism, as described above, the translation mechanism is therefore operable to translate the first sensor 202 and second sensor 204 in the first direction (e.g., −x direction) with respect to the ion beam 110 of FIG. 1. Accordingly, referring now to FIG. 4, an analysis of the relative motion of the measurement apparatus 200 is illustrated, wherein the motion is viewed from the perspective of the measurement apparatus moving through the beam path P of three different ion beams 210A-210C (e.g., the ion beam 110 of FIGS. 1-3 at three differing angles of incidence to the measurement apparatus 104). The first sensor 202 and second sensor 204 are operable to measure one or more characteristics of the ion beams 210A-210C, such as beam current $I_{Beam}$, as each of the first and second sensors pass through the ion beams.

Figure 4:
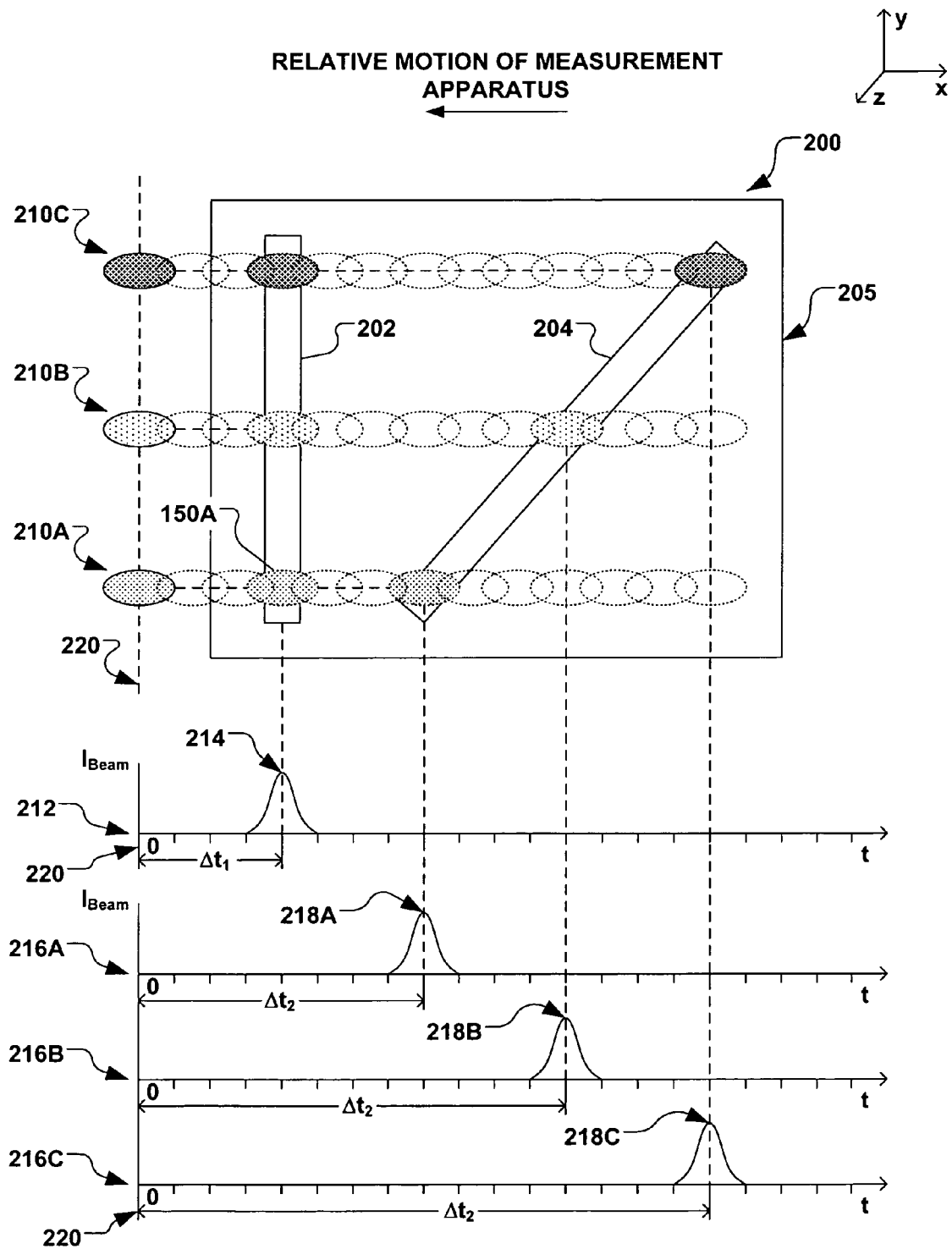
FIG. 4 illustrates a combined plan view of an exemplary measurement apparatus and a graph of peak ion beam characteristics in accordance with yet another aspect of the present invention.

As can be seen in FIG. 4, the beam current $I_{Beam}$ peaks as each ion beam 210A-210C passes through the respective sensor. For example, timeline 212 illustrates the sensed beam current $I_{Beam}$, as the first sensor 202 passes through each of the ion beams 210A-210C, wherein a first peak beam current 214 generally occurs at the same point in time for all three ion beams. Timelines 216A-216C, however, illustrate differing second peak beam currents 218A-218C as the second sensor 204 passes through the respective ion beam 210A-210C at varying times due to the differing vertical positions of the respective ion beam.

As stated above, the controller 106 of FIG. 1 is operably coupled to the translation mechanism 140 and measurement apparatus 104, wherein the controller is further operable to determine one or more of time and positional information of the first sensor 202 and second sensor 204 of FIG. 4 with respect to a datum 220 on the x-y plane as the first peak beam current 214 and second peak beam current 218 are sensed for a given ion beam 110 or 210. Accordingly, the time and/or positional information associated with first sensor 202 and second sensor 204 can be utilized to determine the beam position in the x and y directions (via the oblique angle $\phi$ relationship of the first and second sensors) and the first beam angle $\alpha$ and second beam angle $\beta$ of the ion beam 110 of FIG. 2, as will be described hereafter.

It should be noted that the controller 106 of FIG. 1 is operable to control one or more of the ion implantation apparatus 102 and measurement apparatus 104, wherein the controller is thereby operable to control the trajectory of the ion beam 110. For example, the controller 106 is operable to control the path P of the ion beam 110 with respect to the workpiece 112, by controlling one or more of the power source 108 for producing the ions, the beamline assembly 122 (e.g., controlling the strength and orientation of the magnetic field), as well as controlling the position of the pedestal or chuck 136. The controller 106 is further operable to control a position of the measurement apparatus 104 with respect to the ion beam path P, as will be discussed hereafter. It will be appreciated that the controller 106 may comprise one or more processors and/or computer systems, wherein overall control of the ion implantation system 100 can be attained (e.g., in conjunction with input by an operator).

The determination of the first beam angle a in the first direction (e.g., the x direction) will now be discussed, wherein the controller 106 of FIG. 1 is operable to perform various calculations in order to determine the first beam angle $\alpha$. According to one example, the time and/or positional information associated with the sensor 202 of FIG. 4 being at the position where beam current is sensed to be at a maximum value (e.g., the first peak beam current 214) can be compared to a time and/or position where such a maximum value is expected if the trajectory of the ion beam 110 followed the nominal path $P_{nom}$ of FIG. 2. For example, the nominal path $P_{nom}$ of the ion beam 110 is associated with a peak beam current at the first sensor 202 of FIG. 4 when the first sensor is positioned at the datum 220. Consequently, for an ion beam following the actual path P, such as that of FIG. 2, a difference in time and/or position of the first sensor 202 when the first peak beam current 214 is sensed from a time and/or position of the nominal path $P_{nom}$ (e.g., associated with the datum 220) allows for calculation of the first beam angle $\alpha$. For example, for a measurement apparatus 104 moving at a known constant velocity, an elapsed first time $\Delta t_1$ between the ion beam passing the datum 220 (e.g., associated with the nominal path $P_{nom}$) and the first sensor 202 (e.g., associated with the first peak beam current 214) of FIG. 4 can be converted into a first change in horizontal position $\Delta x_1$ of the measurement apparatus. It should be noted that the first change in horizontal position $\Delta x_1$ is further equal to the deviation in the first direction $\Delta x$ of FIG. 2. Accordingly, since the distance F of FIG. 2 is known, the first beam angle $\alpha$ can be determined from equation (1) by substituting $\Delta x_1$ for $\Delta x$, thus leading to:

$$\alpha = \arctan(\Delta x_1/F) \qquad (3).$$

In the present example, the datum 220 (e.g., t=0) is generally offset in the –x direction from the first sensor 202, as illustrated in FIG. 4. However, it should be noted that the datum 220 can be associated with any position in the x direction with respect to first sensor 202, wherein the change of time and/or position between the ion beam passing first sensor and the datum is utilized in the calculations.

Figure 5:
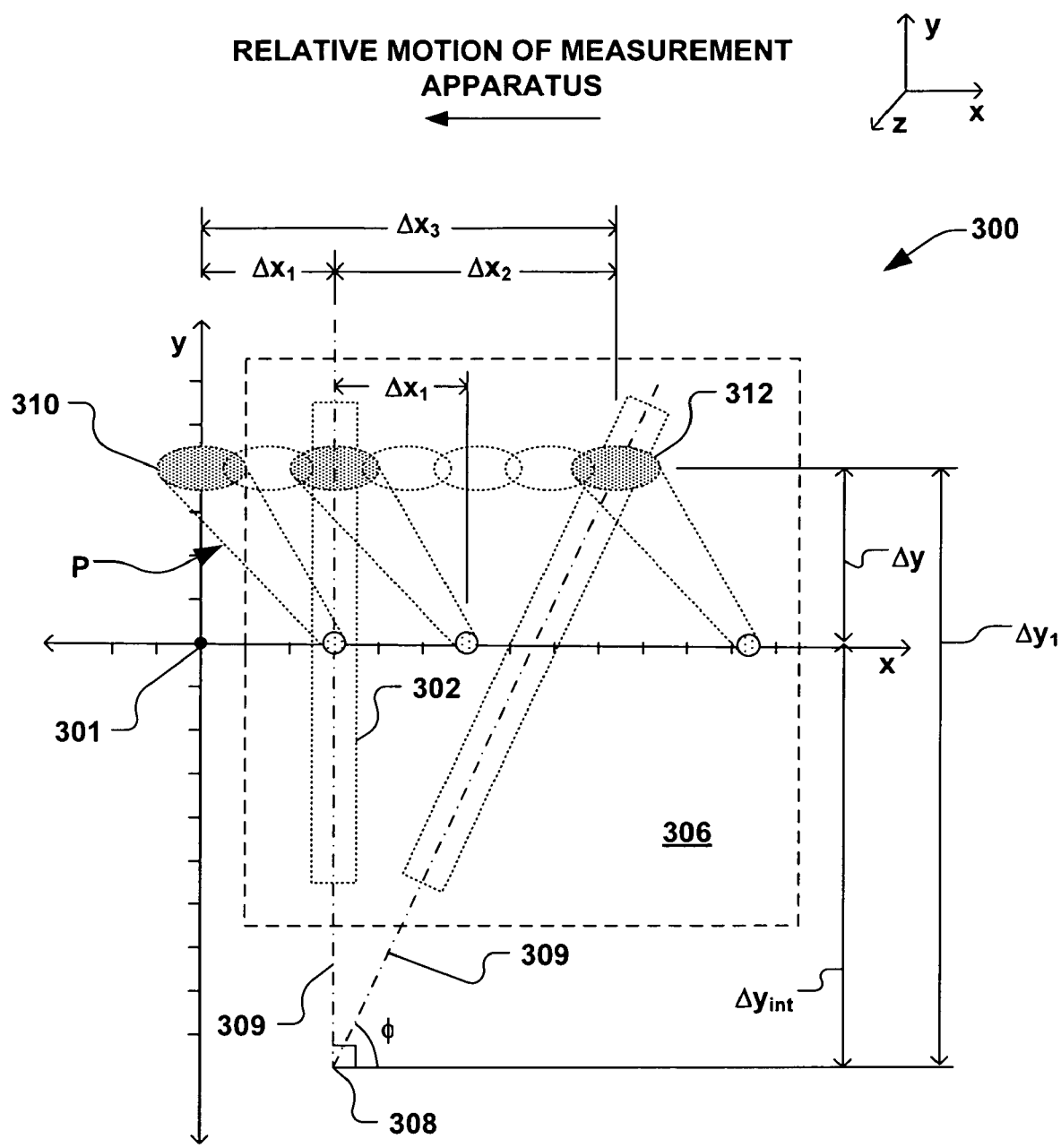
FIG. 5 is another exemplary measurement apparatus illustrating still another aspect of the present invention.

Referring now to FIG. 5, another exemplary measurement apparatus 300 is illustrated, wherein several further aspects of the invention will now be described in greater detail. For example, in accordance with the present invention, the second beam angle $\beta$ of FIG. 2 in the second direction (e.g., the vertical or y direction) can be determined by the controller 106 of FIG. 1, wherein various calculations are performed by the controller in order to determine the second beam angle $\beta$. The measurement apparatus 300 of FIG. 5, for example, is similar to the measurement apparatus 200 of FIG. 4. In accordance with the present example, the datum 301 in the x and y directions of FIG. 5 is further associated with the known second location 158 of FIG. 2. As discussed above, first sensor 302 is positioned generally parallel to the y axis on the x-y plane, wherein the second sensor 304 is angled at the oblique angle $\phi$ on the surface 306 of the measurement apparatus 300. Again, the imaginary intersection point 308 of the first sensor 302 and second sensor 304 is defined by extending the centerlines 309 of each sensor to the point of intersection. Therefore, the imaginary intersection point 308 is positioned at a vertical distance $\Delta y_{int}$ from the datum 301 (e.g., the known second position 158 of FIG. 2) in the y direction, and can be known by either physical measurement or by geometrical calculation. Accordingly, the determination of the second beam angle $\beta$ of FIG. 2 can be determined, based on the imaginary intersection position point 308 of FIG. 5, the oblique angle $\phi$ of the second sensor 304 with respect to the first sensor 302, and by the relative motion of the measurement device 300 (including the first sensor and second sensor with respect to the ion beam 310.

As shown in equation (2), the second beam angle $\beta$ in the second direction (y direction) is a function of the deviation $\Delta y$ in the second direction of the actual position 160 of the ion beam 110 at the surface 152 of the measurement apparatus from the known second position 158 of FIG. 2. Thus, in order to determine the second beam angle $\beta$, the deviation $\Delta y$ in vertical position should be determined. Therefore, referring again to FIG. 4, upon the relative motion of the measurement apparatus 200 with respect to the ion beam 210, an elapsed second time $\Delta t_2$ between the ion beam passing the datum 220 and the second sensor 204 (e.g., associated with the second peak beam current 218) can be converted, as explained above, into a second change in horizontal position $\Delta x_2$ of the measurement apparatus. Therefore, referring again to FIG. 5, a third change in horizontal position $\Delta x_3$ between sensed peak beam currents from the first sensor 302 and second sensor 304 can be determined by:

$$\Delta x_3 = \Delta x_2 - \Delta x_1 \qquad (3).$$

Accordingly, a first difference in vertical position $\Delta y_1$ between the imaginary intersection position point 308 and the actual position 312 of the ion beam 310 at the surface 306 of the measurement apparatus 300 when the second peak beam current 218 is sensed by the second sensor 204 of FIG. 4 can be determined by:

$$\Delta y_1 = \Delta x_3 \tan(\phi) \quad (4).$$

The deviation $\Delta y$ in the second direction between the actual position 312 of the ion beam 310 and the datum 301 (associated with the known second position 158 of FIG. 2) can then be determined by:

$$\Delta y = \Delta y_1 - \Delta y_{int} \quad (5).$$

Accordingly, again referring to FIG. 2, once the deviation $\Delta y$ in the second direction is determined, the second beam angle $\beta$ can be determined by equation (2). Therefore, both the first beam angle $\alpha$ and second beam angle $\beta$ can be determined by single-axis translation of the measurement apparatus 104 of FIG. 1, thus providing a providing a simple, yet robust means of measuring beam angles in the ion implantation system 100.

Figure 6:
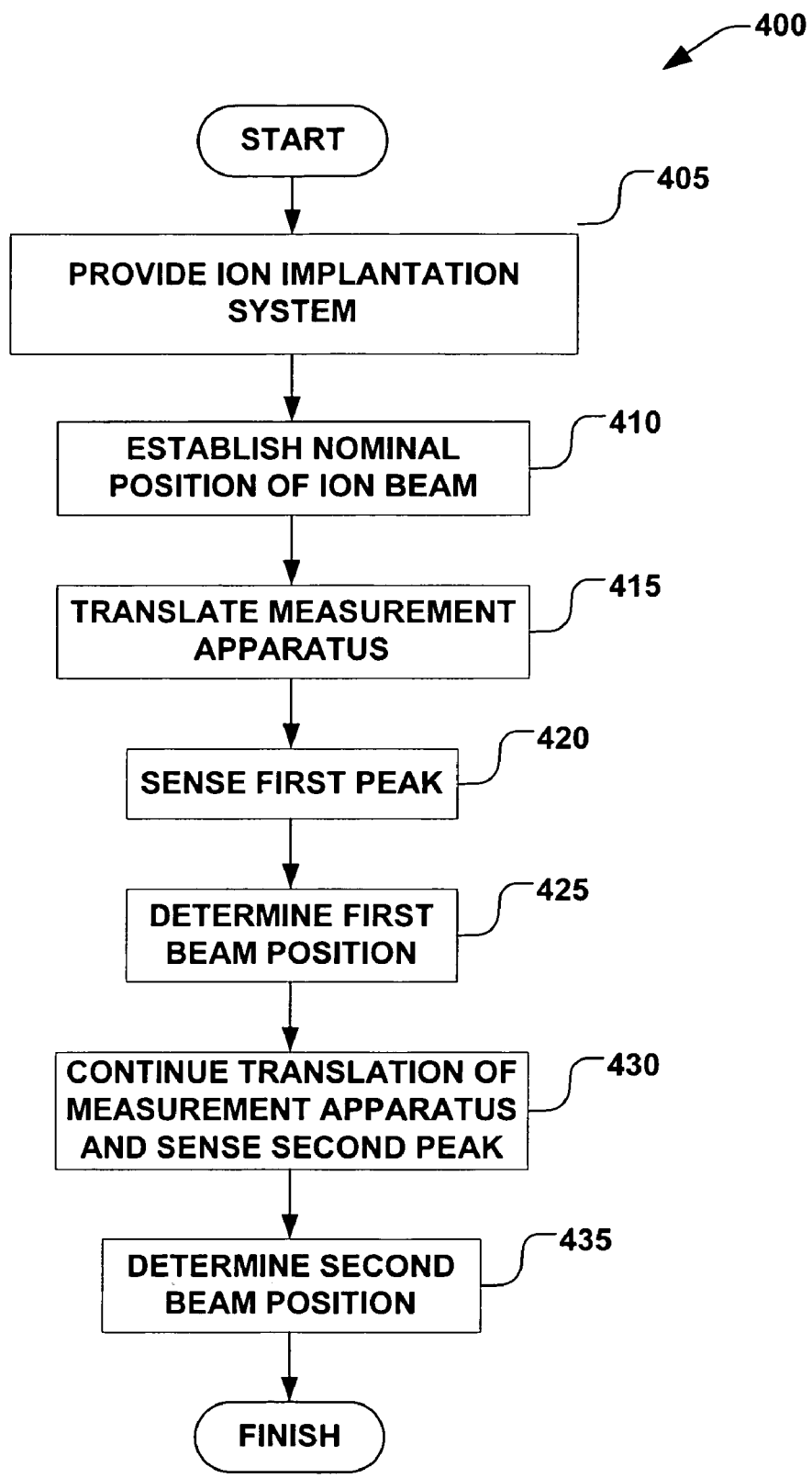
FIG. 6 is a block diagram of an exemplary method for measuring angles of an ion beam according to another exemplary aspect of the invention.

In accordance with another aspect of the present invention, FIG. 6 illustrates a method 400 for measuring ion beam position in two orthogonal directions, such as the horizontal and vertical directions illustrated in accordance with the measurement apparatus 300 of FIG. 5. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 6, the method 400 begins with providing an ion implantation system in act 405, wherein the ion implantation system comprises an ion implantation apparatus, a measurement apparatus, and a translation mechanism operably coupled to the measurement apparatus. For example, the measurement apparatus 300 of FIG. 5 is provided, wherein the translation mechanism 140 of FIG. 1 is operable to translate the translation mechanism in a first direction (e.g., the x-direction).

According to one exemplary aspect of the invention, a nominal position of the ion beam is established with respect to ion implantation system and the measurement apparatus in act 410 of FIG. 6, wherein a distance between the nominal position of the ion beam at a location orthogonal to the surface of the measurement apparatus and a known location of the ion beam with respect to the ion implantation apparatus is known. The measurement apparatus is translated from a start position or time in act 415 of FIG. 6, wherein the measurement apparatus translates in the first direction through an actual path of the ion beam. In act 420, a first peak is sensed by a first sensor, wherein the first peak is associated with a first time or position of the measurement apparatus. A first beam position (e.g., in the x-direction) is determined in act 425, wherein the first beam position is a function of the first time or position of the measurement apparatus. Accordingly, a first beam angle can also be determined in act 425, wherein the first beam angle is a further a function of the known distance between the ion implanter and the surface of the measurement apparatus and the first beam position, as described above.

The measurement apparatus is further translated in act 430, (e.g., a continuation of the translation of act 415) at least until a second peak is sensed by the second sensor, wherein the second peak is associated with a second time or position of the measurement apparatus. A second beam position (e.g., in the y-direction) is determined in act 435, wherein the second beam position is a function of the second time or position of the measurement apparatus, and an angle that the second sensor makes with the first sensor. A second beam angle can be further determined in act 435, wherein the second beam angle is further a function of the known distance between the ion implanter and the surface of the measurement apparatus, and the second beam position, as described above.

According to another exemplary aspect of the invention, after the beam positions are measured, one or more adjustments are performed on the ion implantation system, wherein the method may be performed again, or one or more workpieces may be implanted with ions via the ion beam. Multiple passes of the measurement apparatus through the ion beam may also be performed, if so desired. Furthermore, according to yet another example, the known location of the ion beam with respect to the ion implantation apparatus can be further measured using another measurement apparatus positioned upstream of the above-mentioned measurement apparatus by a predetermined distance.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system, comprising:
    an ion implanter operable to form an ion beam;
    a measurement apparatus having a plane associated therewith, the measurement apparatus further comprising:
        a first elongate sensor, wherein the first elongate sensor extends in a first direction along the plane of the measurement apparatus, and wherein the first elongate sensor is operable to sense one or more characteristics of the ion beam; and
        a second elongate sensor, wherein the second elongate sensor extends along the plane at an oblique angle with respect to the first elongate sensor, and wherein the second elongate sensor is further operable to sense the one or more characteristics of the ion beam;
    a translation mechanism operably coupled to the ion implanter and the measurement apparatus, wherein the translation mechanism is operable to translate the measurement apparatus through a path of the ion beam in a direction generally perpendicular to the first elongate sensor and generally parallel with the plane; and
    a controller configured to control the translation mechanism and to receive the sensed one or more characteristics of the ion beam, wherein the controller is operable to determine a position in two orthogonal directions of the ion beam with respect to the plane of the measurement apparatus based, at least in part, on a position of the measurement apparatus and the one or more characteristics of the ion beam sensed by the first sensor and second sensor.

2. The system of claim 1, wherein the first elongate sensor and second elongate sensor each comprise a slot Faraday.

3. The system of claim 1, wherein a length of the second elongate sensor is greater than or roughly equal to a length of the first elongate sensor.

4. The system of claim 1, wherein the oblique angle ranges between thirty and sixty degrees from the first elongate sensor.

5. The system of claim 1, wherein the translation mechanism comprises a servo motor, wherein the servo motor is operable to provide a signal to the controller indicating the position of the measurement apparatus.

6. The system of claim 1, wherein the translation mechanism is operable to translate the measurement apparatus at a constant velocity, wherein the position of the measurement apparatus is determined by the controller based on an elapsed time at the constant velocity.

7. The system of claim 1, wherein the ion implanter comprises a pedestal or chuck for holding a workpiece, and wherein the translation mechanism is further operably coupled to the pedestal or chuck.

8. The system of claim 1, wherein the plane of the measurement apparatus is generally defined by a surface of the measurement apparatus, and wherein the first sensor and second sensor are operably coupled to the surface of the measurement apparatus.

9. The system of claim 1, wherein the controller is further operable to determine a first beam angle and a second beam angle of the ion beam with respect to the plane of the measurement apparatus based, at least in part, on the position of the measurement apparatus and the one or more characteristics of the ion beam sensed by the first sensor and second sensor.

10. An ion beam measurement apparatus, comprising:
    a first elongate sensor, wherein the first elongate sensor extends in a first direction along a plane of the measurement apparatus, and wherein the first elongate sensor is operable to sense one or more characteristics of an ion beam;
    a second elongate sensor, wherein the second elongate sensor extends along the plane of the measurement apparatus at an oblique angle with respect to the first elongate sensor, and wherein the second elongate sensor is further operable to sense the one or more characteristics of the ion beam; and
    a translation mechanism operably coupled to the measurement apparatus, wherein the translation mechanism is operable to translate the measurement apparatus through a path of the ion beam in a direction generally perpendicular to the first elongate sensor and generally parallel with the plane.

11. The system of claim 10, wherein the first elongate sensor and second elongate sensor each comprise a slot Faraday.

12. The system of claim 10, wherein a length of the second elongate sensor is greater than or roughly equal to a length of the first elongate sensor.

13. The system of claim 10, wherein the oblique angle ranges between thirty and sixty degrees from the first elongate sensor.

14. The system of claim 10, wherein the translation mechanism comprises a servo motor, wherein the servo motor is operable to provide a signal indicating a position of the measurement apparatus.

15. The system of claim 10, further comprising a pedestal or chuck for holding a workpiece, and wherein the pedestal or chuck is further operably coupled to the translation mechanism.

16. The system of claim 10, wherein the plane of the measurement apparatus is generally defined by a surface of the measurement apparatus, and wherein the first sensor and second sensor are operably coupled to the surface of the measurement apparatus.

17. A method for measuring a position of an ion beam, the method comprising:
    providing an ion beam and a measurement apparatus having a plane associated therewith, the measurement apparatus further comprising a first elongate sensor and a second elongate sensor associated with the plane of the measurement apparatus, wherein the second elongate sensor is positioned generally obliquely with respect to the first elongate sensor;
    translating the measurement apparatus in a first direction generally perpendicular to the first elongate sensor through the ion beam;
    obtaining a first peak beam current associated with the first elongate sensor passing through the ion beam at a first time;
    obtaining a second peak beam current associated with the second elongate sensor passing through the ion beam at a second time; and
    determining a first beam position of the ion beam in the first direction and a second beam position of the ion beam in a second direction perpendicular to the first direction, wherein the first direction and second direction are parallel with the plane of the measurement apparatus, and wherein the determination is based, at least in part, on the first time, the second time, and an angle at which the first and second sensors are positioned relative to one another.

18. The method of claim 17, wherein the measurement apparatus is translated at a generally constant velocity, and wherein a position of the measurement apparatus at the first time and second time is further determined based on the constant velocity.

19. The method of claim 17, wherein the determination of the second position is further based on a difference between the first time and the second time.

20. The method of claim 17, further comprising determining a first beam angle of the ion beam in the first direction and a second beam angle of the ion beam in the second direction, wherein the determination is based, at least in part, on the first time, the second time, and a known position of the ion beam along a path orthogonally upstream of the plane of the measurement apparatus.

* * * * *